US010672853B2

(12) United States Patent
Ha et al.

(10) Patent No.: US 10,672,853 B2
(45) Date of Patent: Jun. 2, 2020

(54) FLEXIBLE DISPLAY APPARATUS (71) Applicant: Samsung Display Co., Ltd., Yongin-si, Gyeonggi-do (KR)

(72) Inventors: Seunghwa Ha, Yongin-si (KR); Euiyun Jang, Yongin-si (KR); Donghee Park, Yongin-si (KR); Jihoon Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/339,871

(22) Filed: Oct. 31, 2016

(65) Prior Publication Data

US 2017/0170255 A1      Jun. 15, 2017

(30) Foreign Application Priority Data

Dec. 15, 2015   (KR) .......................... 10-2015-0179196

(51) Int. Cl.
| | |
|---|---|
| *H01L 27/32* | (2006.01) |
| *G06F 1/16* | (2006.01) |
| *G09F 9/30* | (2006.01) |
| *H05K 1/14* | (2006.01) |
| *H01L 51/00* | (2006.01) |
| *H05K 1/11* | (2006.01) |

(52) U.S. Cl.
CPC ........ *H01L 27/3276* (2013.01); *G06F 1/1652* (2013.01); *G09F 9/301* (2013.01); *H01L 51/0097* (2013.01); *H05K 1/147* (2013.01); *H01L 2251/5338* (2013.01); *H05K 1/113* (2013.01); *H05K 1/115* (2013.01); *H05K 2201/055* (2013.01); *H05K 2201/056* (2013.01); *H05K 2201/10128* (2013.01); *Y02E 10/549* (2013.01)

(58) Field of Classification Search
CPC ............ H01L 27/3276; H01L 51/0097; G06F 1/1652; G09F 9/301
USPC .......................................................... 257/40
See application file for complete search history.

(56) References Cited

U.S. PATENT DOCUMENTS

| | | | |
|---|---|---|---|
| 5,436,744 A * | 7/1995 | Arledge .............. | G02F 1/13452 349/150 |
| 2014/0217382 A1 | 8/2014 | Kwon et al. | |

(Continued)

FOREIGN PATENT DOCUMENTS

| | | |
|---|---|---|
| KR | 10-2014-0099174 A | 8/2014 |
| KR | 10-2014-0108825 A | 9/2014 |

(Continued)

*Primary Examiner* — Robert T Huber
(74) *Attorney, Agent, or Firm* — Lewis Roca Rothgerber Christie LLP (57) ABSTRACT

The present disclosure describes a flexible display apparatus that includes a display substrate including a light-emitting area, and a non-emitting area including a bending area foldable in a folding direction outside of the light-emitting area, and a pad area outside of the bending area, a thin film encapsulation layer over the light-emitting area, and a driver inside a curvature portion of the display substrate at the bending area, and including a plurality of driving terminals electrically connected to a plurality of pad terminals in the pad area through penetration wirings in via holes defined by the display substrate to provide a new, thinner flexible display apparatus.

19 Claims, 6 Drawing Sheets

(56) References Cited

U.S. PATENT DOCUMENTS

| | | |
|---|---|---|
| 2014/0240933 A1 | 8/2014 | Lee et al. |
| 2014/0300849 A1 | 10/2014 | Jung et al. |
| 2014/0307396 A1 | 10/2014 | Lee |
| 2015/0036300 A1 | 2/2015 | Park et al. |

FOREIGN PATENT DOCUMENTS

| | | |
|---|---|---|
| KR | 10-2014-0108826 A | 9/2014 |
| KR | 10-2014-0108827 A | 9/2014 |
| KR | 10-2014-0121178 A | 10/2014 |
| KR | 10-2014-0122595 A | 10/2014 |
| KR | 10-2014-0122597 A | 10/2014 |
| KR | 10-2015-0014713 A | 2/2015 |

* cited by examiner

FLEXIBLE DISPLAY APPARATUS

CROSS-REFERENCE TO RELATED APPLICATION

This application claims priority to, and the benefit of, Korean Patent Application No. 10-2015-0179196, filed on Dec. 15, 2015 in the Korean Intellectual Property Office, the disclosure of which is incorporated herein in its entirety by reference.

BACKGROUND

1. Field

One or more embodiments relate to a flexible display apparatus.

2. Description of the Related Art

Generally, a display apparatus may be used in a mobile apparatus, such as a smart phone, a laptop computer, a digital camera, a camcorder, a portable information terminal, a notebook, or a table personal computer, or may be used in an electronic apparatus, such as a desktop computer, a television, a billboard, or an exhibit display apparatus.

Recently, a slimmer display apparatus has been released in the market. A flexible display apparatus is easy to carry, and may be used in various apparatuses. The flexible display device may include an organic light-emitting display apparatus. The flexible display apparatus may have a suitably narrow bezel.

SUMMARY

One or more embodiments include a flexible display apparatus having a bezel that is reduced in width.

Additional aspects will be set forth in part in the description that follows, and, in part, will be apparent from the description, or may be learned by practice of the presented embodiments.

According to one or more embodiments, a flexible display apparatus includes a display substrate including a light-emitting area, and a non-emitting area including a bending area foldable in a folding direction outside of the light-emitting area, and a pad area outside of the bending area, a thin film encapsulation layer over the light-emitting area, and a driver inside a curvature portion of the display substrate at the bending area, and including a plurality of driving terminals electrically connected to a plurality of pad terminals in the pad area through penetration wirings in via holes defined by the display substrate.

The thin film encapsulation layer may be over a first surface of the display substrate, and the driver may be below a second surface of the display substrate that is opposite to the first surface.

The driving terminals may be connected to the pad terminals at the second surface of the display substrate.

Each of the pad terminals may include a first end on the first surface of the display substrate, and a second end on the second surface of the display substrate, electrically connected to the first end through a corresponding one of the penetration wirings, and connected to a respective one of the driving terminals.

At least a portion of the pad area may overlap a thin film encapsulation layer in a thickness direction of the display substrate.

The driver may be between the light-emitting area and the pad area.

At least one component may be in a gap between the light-emitting area and the pad area.

The gap may be between a first portion of the second surface of the display substrate, which corresponds to the light-emitting area, and a second portion of the second surface of the display substrate, which corresponds to the pad area.

A radius of curvature of the display substrate may accommodates the at least one component.

The bending area may be folded in the folding direction away from the thin film encapsulation layer about a bending line spaced from an edge of the thin film encapsulation layer.

At least a portion of the driver may be foldable.

An extension of a bending area of the driver may be outside of a curvature portion of the display substrate.

A radius of curvature of the driver may accommodate the display substrate.

The flexible display apparatus may further include at least one protection film on the second surface, and defining a space therein, and the bending area may be adjacent the space defined by the protection film.

The non-emitting area and the light-emitting area may collectively define notches at corners thereof.

The driver may include a flexible film, and a driving integrated circuit (IC) on the flexible film, and the driving terminals may be at an edge of the flexible film at positions corresponding to the pad terminals.

The driver may include a flexible film, and a driving integrated circuit (IC) on the second surface of the display substrate, and the driving terminals may be at an edge of the flexible film, and are electrically connected to the driving integrated circuit (IC) through the pad terminals.

The pad terminals may include a plurality of first pad terminals at a first row of the display substrate, and a plurality of second pad terminals at a second row of the display substrate.

The first row may be adjacent the second row in a first direction, and the first pad terminals and the second pad terminals may be alternately positioned in a second direction crossing the first direction.

The display substrate may include a thin film transistor, an organic light-emitting device electrically connected to the thin film transistor; and a plurality of insulation layers insulating the thin film transistor from the organic light-emitting device, wherein the plurality of insulation layers include planarization film or pixel defining film.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
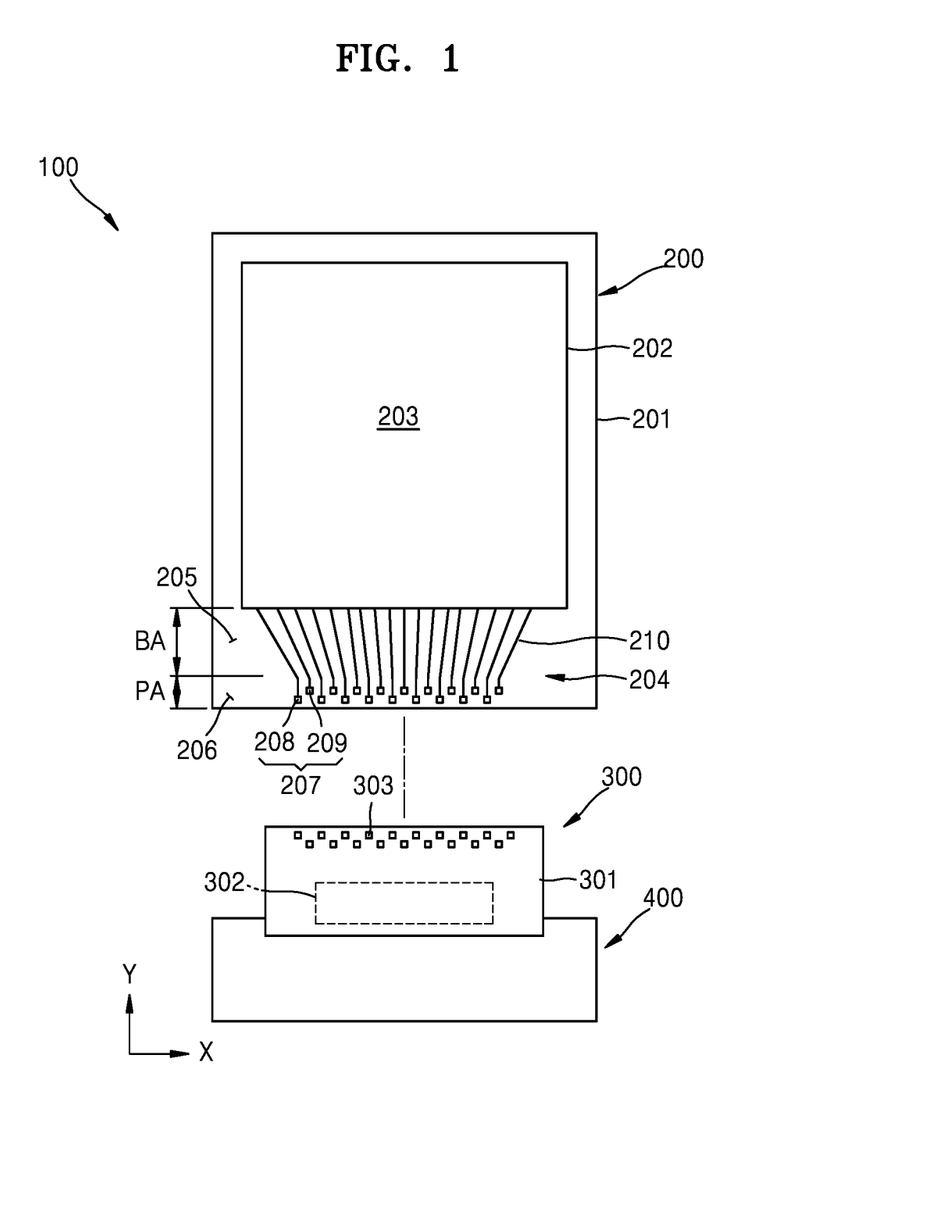
FIG. 1 is a plan view illustrating a flexible display apparatus according to an embodiment.

FIG. 1 is a plan view illustrating a flexible display apparatus 100 according to an embodiment.

Referring to FIG. 1, the flexible display apparatus 100 includes a display panel 200, a driver 300 electrically connected to the display panel 200, and a circuit board 400 connected to the driver 300.

In the present embodiment, the flexible display apparatus 100 corresponds to an organic light-emitting display, as an example. However, the present disclosure is not limited thereto. The flexible display apparatus 100 may include a liquid crystal display, a field emission display, or an electronic paper display.

The display panel 200 includes a display substrate 201 having a plurality of elements, and a thin film encapsulation (TFE) layer 202 over the display substrate 201.

The display substrate 201 includes a light-emitting area 203, which displays an image, and a non-emitting area 204. The non-emitting area 204 includes a bending area BA/205 for folding the display substrate 201 in a folding direction, and a pad area PA/206 outside of, and/or extending from, the bending area 205.

A plurality of pad terminals 207 may be in the pad area 206. The pad terminals 207 may be connected to wirings 210 that extend from the light-emitting area 203. The pad terminals 207 include a plurality of first pad terminals 208 at a first row of the display substrate 201, and include a plurality of second pad terminals 209 at a second row of the display substrate 201. The first row and the second row are located in a Y direction (e.g., a first direction) of the display substrate 201 with respect to each other, and extend in an X direction (e.g., a second direction) of the display substrate 201. Locations of the first pad terminals 208 correspond to locations between respective adjacent ones of the second pad terminals 209 in the X direction. Although the embodiment illustrates that the pad terminals 207 are on two rows, the present disclosure is not limited thereto.

The driver 300 includes a driving circuit. The driver 300 may include a chip on film (COF) structure. For example, the driver 300 includes a flexible film 301, a driving integrated circuit (IC) 302 on the flexible film 301, and a plurality of driving terminals 303 at an edge portion of the flexible film 301. The plurality of driving terminals 303 may be respectively connected to the pad terminals 207. The driving terminals 303 may correspond to respective ones of the pad terminals 207.

The driver 300 may be electrically connected to the circuit board 400. The circuit board 400 may include a flexible printed circuit board (FPCB).

To reduce a width of a bezel of the flexible display apparatus 100, at least a portion of the non-emitting area 204 of the flexible display apparatus 100 may be folded.

Figure 2:
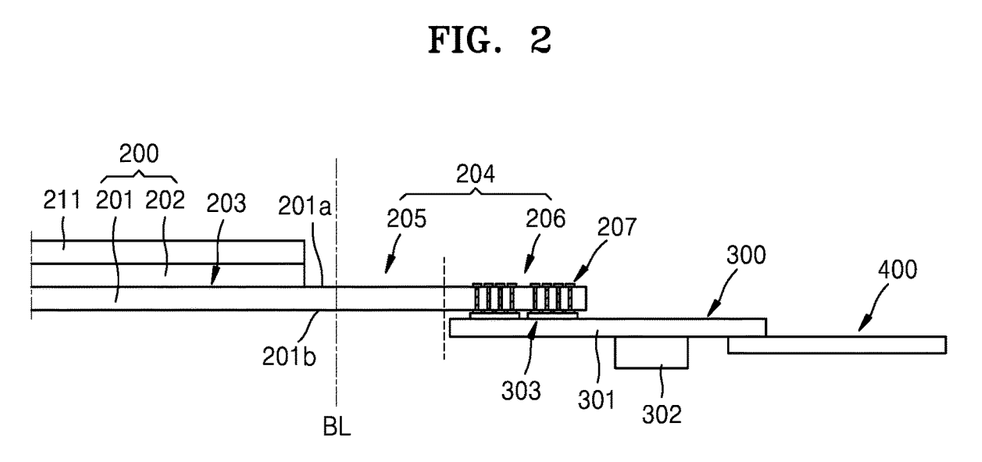
FIG. 2 is a cross-sectional view illustrating an assembled state of the flexible display apparatus of FIG. 1.
Figure 3:
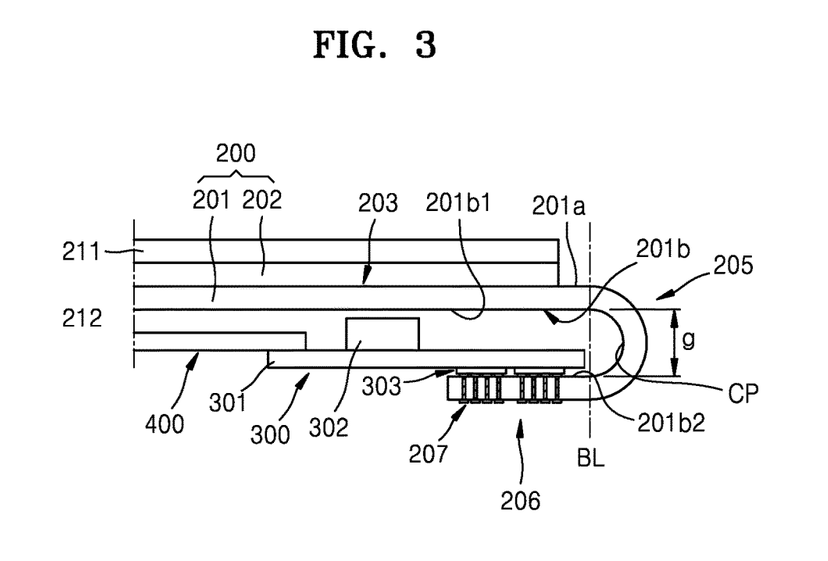
FIG. 3 is a cross-sectional view illustrating a folded state of the flexible display apparatus of FIG. 2.

FIG. 2 is a cross-sectional view illustrating an assembled state of the flexible display apparatus 100 of FIG. 1, and FIG. 3 is a cross-sectional view illustrating a folded state of the flexible display apparatus 100 of FIG. 2.

Referring to FIGS. 2 and 3, the display substrate 201 may include a flexible film. The display substrate 201 includes the light-emitting area 203, and includes the non-emitting area 204 surrounding the light-emitting area 203.

The TFE layer 202 may be over a first surface 201a of the display substrate 201. The TFE layer 202 may cover the light-emitting area 203. A functional film 211 may be over the TFE layer 202. The functional film 211 may include at least one of various films, such as a polarizer and/or a touch screen.

A back film may be on a second surface 201b of the display substrate 201, the second surface 201b being opposite to the first surface 201a of the display substrate 201. The back film may include plastic or metal. The back film may support the display substrate 201.

The plurality of pad terminals 207 of the pad area 206 may be electrically connected to the plurality of driving terminals 303 of the driver 300, respectively.

Figure 4:
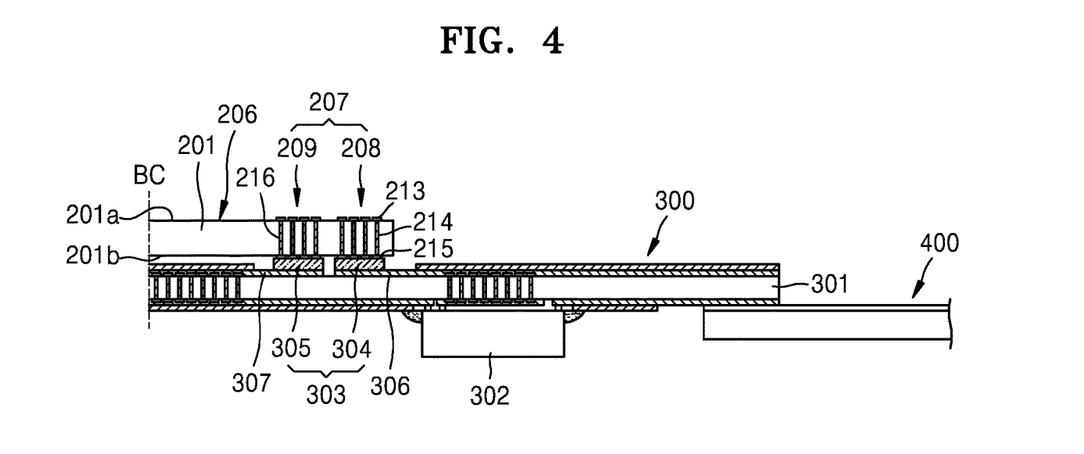
FIG. 4 is a cross-sectional view illustrating a pad area of the flexible display apparatus of FIG. 2.

Referring to FIG. 4, the plurality of first pad terminals 208 and the plurality of second pad terminals 209 are spaced apart from each other in the pad area 206. The plurality of first pad terminals 208 may have a same structure as the plurality of second pad terminals 209.

Each of the plurality of pad terminals 207 may include a first terminal/end 213, a penetrating wiring 214, and a second terminal/end 215. The first terminal 213 may be on the first surface 201a of the display substrate 201. The second terminal 215 may be on the second surface 201b of the display substrate 201. The first terminal 213 and the second terminal 215 may be electrically connected to each other through the penetrating wiring 214.

In detail, a plurality of via holes 216 may penetrate the display substrate 201. The penetrating wiring 214 may fill at least a portion of the respective via holes 216. One end of the penetrating wiring 214 may be connected to the first terminal 213, and the other end of the penetrating wiring 214 may be connected to the second terminal 215. Accordingly, the first terminal 213 and the second terminal 215, which are on the first surface 201a and the second surface 201b of the display substrate 201, respectively, may be electrically connected to each other.

The plurality of driving terminals 303 may be connected to a lower side portion of the display substrate 201, that is, may be connected to the plurality of pad terminals 207 that are on the second surface 201b of the display substrate 201.

In detail, the driver 300 may be at/over/under (under, as shown in the orientation of FIG. 4) the second surface 201b of the display substrate 201. The plurality of driving terminals 303 may be on the flexible film 301. The plurality of driving terminals 303 may respectively correspond to the second terminals 215 of the plurality of pad terminals 207. The plurality of driving terminals 303 may be electrically connected to the corresponding second terminals 215 of the plurality of pad terminals 207 at the second surface 201b of the display substrate 201.

In an embodiment, the plurality of driving terminals 303 include a plurality of first driving terminals 304, and a plurality of second driving terminals 305 spaced apart from the plurality of first driving terminals 304.

The plurality of first driving terminals 304 may be electrically connected to respective ones of the first pad terminals 208. The plurality of second driving terminals 305 may be electrically connected to respective ones of the second pad terminals 209. The plurality of first driving terminals 304 and the plurality of second driving terminals 305 may be alternately arranged in the X direction at an edge of the flexible film 301 (e.g., to correspond to the arrangement of the first and second pad terminals 208 and 209).

The plurality of first driving terminals 304 may be electrically connected to first driving wirings 306, which are on the flexible film 301. The plurality of second driving terminals 305 are electrically connected to second driving wirings 307, which are also on the flexible film 301.

The plurality of first driving terminals 304 and the plurality of second driving terminals 305 are electrically connected to a driving IC 302 through corresponding electrical paths. A method of connecting the plurality of first driving terminals 304 and the plurality of second driving terminals 305 to the driving IC 302 is not limited to a particular one of various methods.

As described above, the plurality of driving terminals 303 might not be connected to the plurality of pad terminals 207 at the first surface 201a of the display substrate 201 over which the TFE layer 202 (FIG. 2) is located (e.g., might not be connected to the first terminals 213 of the pad terminals 207), but may instead be connected to the plurality of pad terminals 207 while being on the second surface 201b of the display substrate 201 (e.g., may be connected to the second terminals 215 of the pad terminals 207), the second surface 201b being opposite to the first surface 201a.

Accordingly, when the flexible display apparatus of FIG. 1 is folded, as shown in FIG. 3, the driver 300 may be located inside a curvature portion (CP) of the display substrate 201 (e.g., at the bending area 205) so that breakage of components, such as the driving IC 302 of the driver 300, may be avoided.

Referring back to FIGS. 2 and 3, the bending area 205 of the display substrate 201 may be bendable in a folding direction.

In detail, a bending line BL, which is a virtual line, may be located in a gap of the display substrate 201 that is spaced apart from an edge of the TFE layer 202. The bending line BL may be, or may correspond to, a folding line to fold the display substrate 201. When the bending line BL is close to the edge of the TFE layer 202, the bezel is effectively reduced in size/width.

The bending area 205 may be folded in the folding direction, which is opposite to a direction in which the TFE layer 202 is located over the display substrate 201. The pad area 206 is outside the bending area 205. The bending area 205 and the pad area 206 are sequentially arranged on the display substrate 201. When the bending area 205 is folded, at least a portion of the pad area 206, which is extended outside the bending area 205, may overlap the TFE layer 202 in a vertical direction/thickness direction of the display apparatus 100, as illustrated in FIG. 3.

The driver 300 may be between the light-emitting area 203 and the pad area 206. In detail, the driver 300 may be on the second surface 201b of the display substrate 201. The plurality of driving terminals 303 may contact the plurality of pad terminals 207 over the second surface 201b of the display substrate 201. When the bending area 205 is folded, the driver 300 faces the light-emitting area 203.

A first portion 201b1 of the second surface 201b of the display substrate 201, which corresponds to the light-emitting area 203, may face a second portion 201b2 of the second surface 201b of the display substrate 201, which corresponds to the pad area 206. The driver 300, which is on the second surface 201b of the display substrate 201 which corresponds to the pad area 206, may be inside a curvature portion (CP) of the display substrate 201.

A gap "g" may be between the light-emitting area 203 and the pad area 206. At least one component may be in the gap "g." In detail, the gap "g" may be between the first portion 201b1 of the second surface 201b of the display substrate 201, which corresponds to the light-emitting area 203, and the second portion 201b2 of the second surface 201b of the display substrate 201, which corresponds to the pad area 206.

The driving IC 302 may be on the flexible film 301 in the gap "g." Although the driving IC 302 is on the flexible film 301 in the gap "g" in the present embodiment, another component may be in the gap "g." A radius of curvature of the display substrate 201 may correspond to a size to accommodate the flexible film 301 and the driving IC 302.

Figure 5:
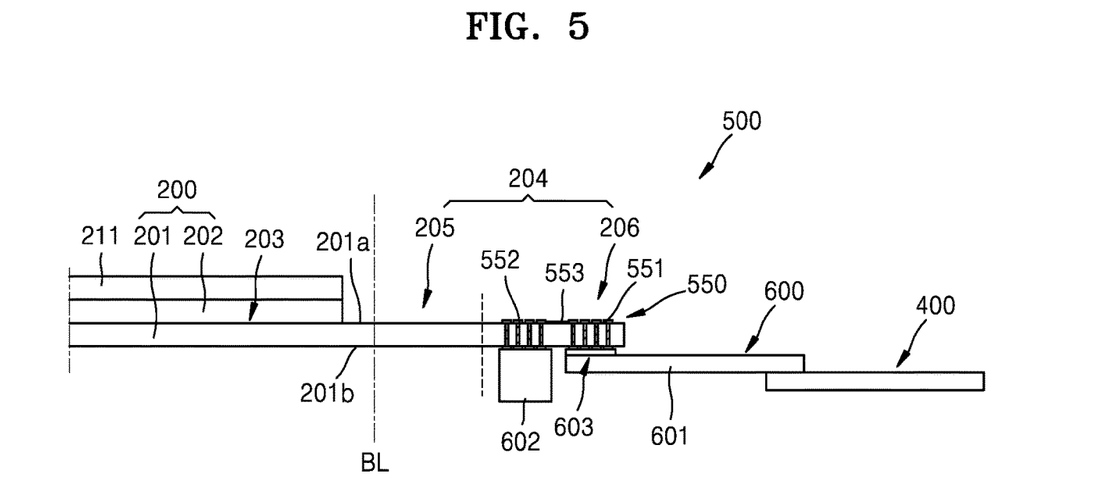
FIG. 5 is a cross-sectional view illustrating a flexible display apparatus according to another embodiment.
Figure 6:
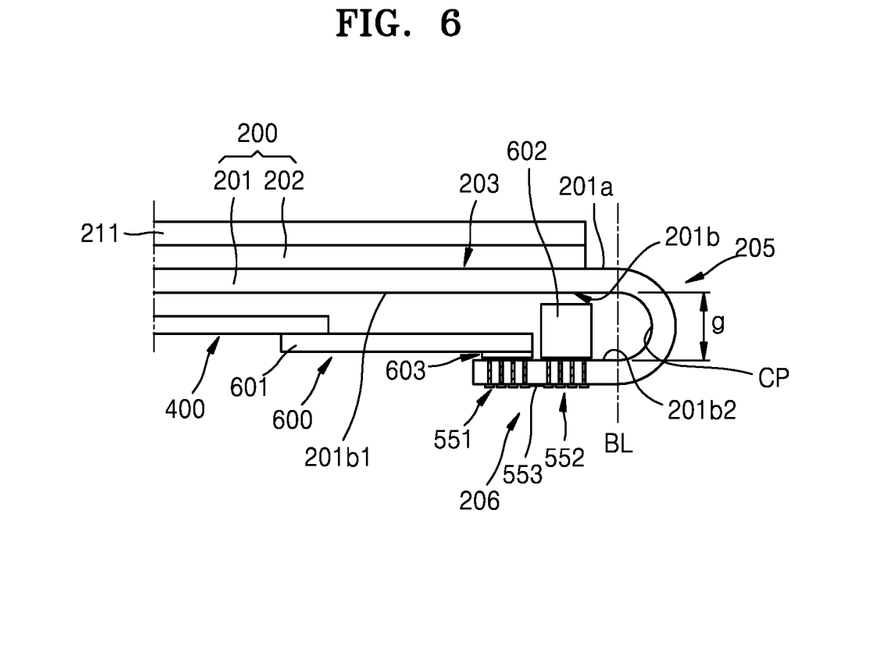
FIG. 6 is a cross-sectional view illustrating a folded state of the flexible display apparatus of FIG. 5.

FIG. 5 is a cross-sectional view illustrating a flexible display apparatus 500 according to another embodiment, and FIG. 6 is a cross-sectional view illustrating a folded state of the flexible display apparatus 500 of FIG. 5.

Referring FIGS. 5 and 6, a plurality of pad terminals 550 may be in a pad area 206 of the display substrate 201. The pad terminals 550 include a plurality of first pad terminals 551, and a plurality of second pad terminals 552 that are spaced apart from the plurality of first pad terminals 551. The first pad terminals 551 and the second pad terminals 552 may be electrically connected to each other through connection wirings 553.

A driver 600 may be connected to the pad terminals 550. The driver 600 may include a driving circuit, and may include a chip on plastic (COP) structure. The driver 600 is electrically connected to a circuit board 400. The driver 600 of the present embodiment includes a flexible film 601, a driving integrated circuit (IC) 602, and a plurality of driving terminals 603.

The driving terminals 603 may be on the flexible film 601. The driving terminals 603 may be connected to the first pad terminals 551 while being located at the second portion 201b2 of the second surface 201b of the display substrate 201.

The driving IC 602 may be mounted on/below the display substrate 201. The driving IC 602 may be on the second portion 201b2 of the second surface 201b of the display substrate 201. The driving IC 602 may be connected to the second pad terminals 552. The driving IC 602 may be electrically connected to the driving terminals 603 through the connection wirings 553, and through the first and second pad terminals 551 and 552. As such, the driver 600 may be connected to the pad terminals 550 while being at the second surface 201b of the display substrate 201.

The bending area 205 of the display substrate 201 may be folded. The bending area 205 may be folded in a direction which is opposite to a direction in which the TFE layer 202 is over the display substrate 201 (e.g., the display substrate 201 may be folded away from the TFE layer 202). The bending area 205 may be folded about a bending line BL, which is a virtual line.

When the bending area 205 is folded, at least a portion of the pad area 206, which is extended outside the bending area 205, may overlap the TFE layer 202 in a vertical direction of the folded flexible display apparatus 500, as illustrated in FIG. 6.

When the bending area 205 is folded, the first portion 201b1 of the second surface 201b of the display substrate 201, which corresponds to the light-emitting area 203, may face the second portion 201b2 of the second surface 201b of the display substrate 201, which corresponds to the pad area 206. The driver 600 may be between the light-emitting area 203 and the pad area 206. The driver 600 may be inside a curvature portion (CP) of the display substrate 201.

A gap "g" may exist between the light-emitting area 203 and the pad area 206. The driving IC 602 may be in the gap "g." Another component may also be in the gap "g." In an embodiment, a thickness of the driving IC 602 may be greater than a thickness of the flexible film 601 above the driving IC 602. A radius of curvature of the display substrate 201 may correspond to a curvature of a suitable dimension to accommodate the dimensions of the driving IC 602.

Figure 7:
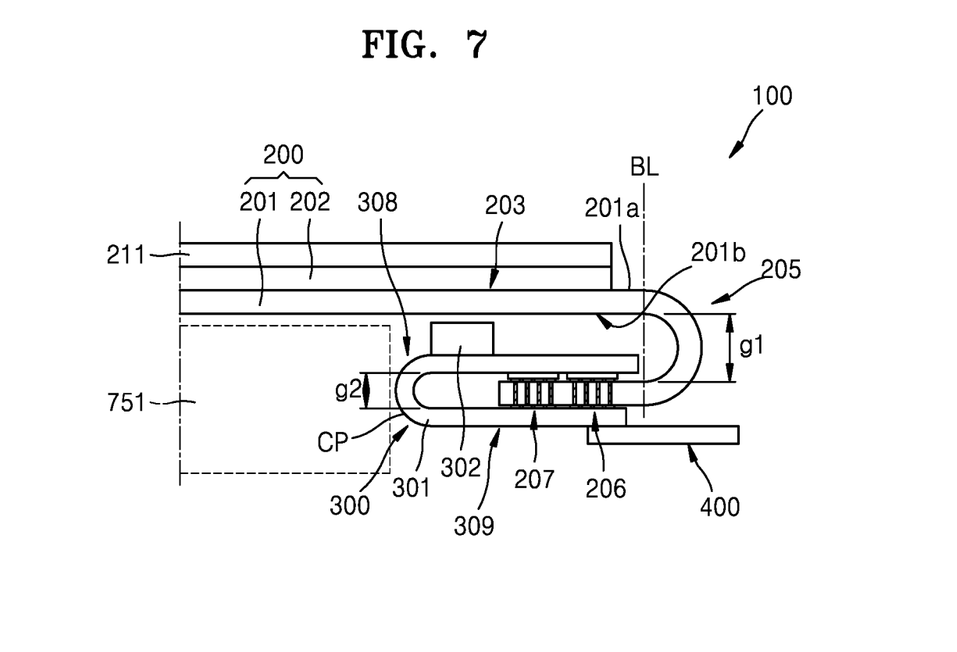
FIG. 7 is a cross-sectional view illustrating a modification of the flexible display apparatus of FIG. 3.

FIG. 7 is a cross-sectional view illustrating a modification of the flexible display apparatus 100 of FIG. 3.

Referring to FIG. 7, a component 751, such as a battery, may be below the display substrate 201. At least a portion of the driver 300 may be folded to prevent interference with the component 751.

In detail, when the bending area 205 is folded, the driver 300 may be between the light-emitting area 203 and the pad area 206. Here, the flexible film 301 may be between the display substrate 201 and the component 751.

The flexible film 301, which overlaps the component 751, is folded in a lower direction of FIG. 7 (e.g., is folded away from the component 751), and interference that may otherwise occur between the flexible film 301 and the component 751 may be avoided. A bending area 308 of the flexible film 301 may be folded in a direction which is opposite to a direction in which the driving IC 302 is over the flexible film 301.

When the flexible film 301 is folded, an extension 309 that extends from the bending area 308 may be outside a curvature portion (CP) of the display substrate 201. A radius of curvature of the flexible film 301 may correspond to a size to accommodate the display substrate 201.

As such, the bending area 205 of the display substrate 201 may be firstly folded, and then the bending area 308 of the flexible film 301 may be secondly folded. Accordingly, a first gap "g1," in which the driving IC 302 is located, may be between the light-emitting area 203 and the pad area 206. A second gap "g2," which corresponds to a thickness of the display substrate 201 (e.g., corresponds to a thickness of the display substrate 201 plus the thickness of the pad terminals 207 and the driving terminals 303), may be between the driving terminals 303 and the extension 309 of the flexible film 301.

Figure 8:
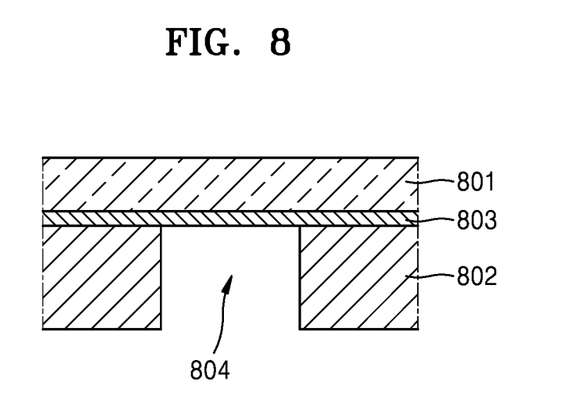
FIG. 8 is a partially cut cross-sectional view illustrating a flexible display apparatus according to another embodiment.

FIG. 8 is a partially cut and enlarged cross-sectional view illustrating a display substrate 801 of a flexible display apparatus according to another embodiment.

Referring to FIG. 8, the display substrate 801 may include a flexible film. A protection film 802 may be below the display substrate 801. The protection film 802 may maintain rigidity of the display substrate 801. An adhesive layer 803 may be between the display substrate 801 and the protection film 802.

A thickness of the protection film 802 may be greater than a thickness of the display substrate 801. For example, the display substrate 801 may include polyimide (PI), and a thickness of the display substrate 801 may be about 10 μm. The protection film 802 may include polyethylene terephthalate (PET), and a thickness of the protection film 802 may be about 75 μm, for example.

When the display substrate 801 is folded, the display substrate 801 might not be easily folded due to the thickness of the protection film 802. In an embodiment, a portion of the protection film 802 may be omitted in a bending area 804 of the display substrate 801 such that the display substrate 801 may be easily folded (e.g., the protection film 802 may define a space therein to facilitate folding of the display substrate 801).

Figure 9:
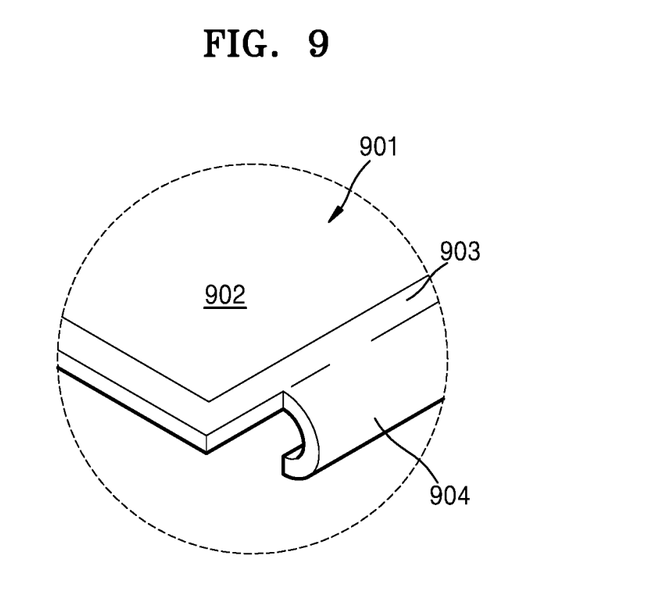
FIG. 9 is an enlarged perspective view illustrating a folded state of a flexible display apparatus according to another embodiment.

FIG. 9 is an enlarged perspective view illustrating a folded state of a display substrate 901 of a flexible display apparatus according to another embodiment.

Referring to FIG. 9, the display substrate 901 includes a light-emitting area 902 and a non-emission area 903 surrounding the light-emitting area 902. At least a portion of the non-emission area 903 may be cut off, or separated, from the display substrate 901 at both edges of the non-emission area 903. That is, the light-emitting area 902 and the non-emission area 903 including the bending area 904, while in an unbent state, may define notches at corners thereof. Accordingly, a bending area 904 of the non-emission area 903 may be easily folded without interference from corners of the display substrate 901.

Figure 10:
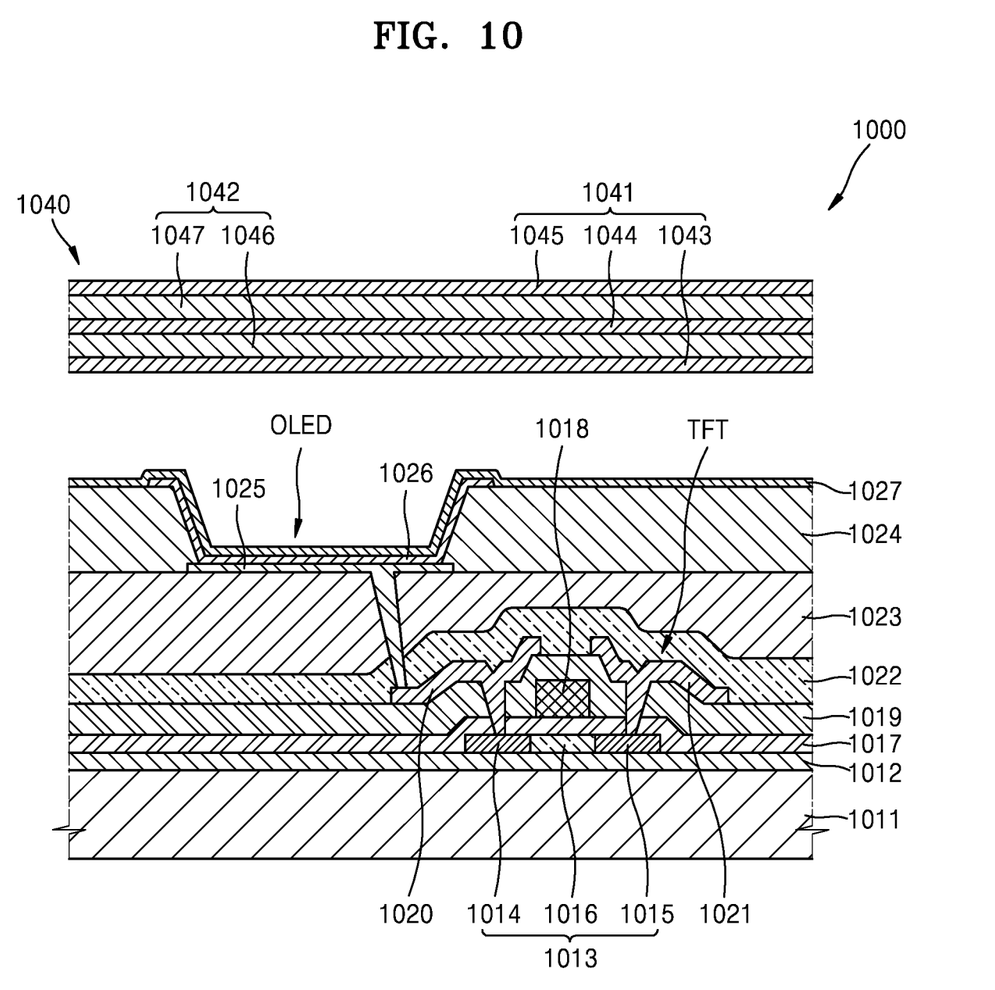
FIG. 10 is a cross-sectional view illustrating a sub-pixel of an organic light-emitting display apparatus according to another embodiment.

FIG. 10 is a cross-sectional view illustrating a sub-pixel of an organic light-emitting display apparatus 1000 according to another embodiment.

In an embodiment, the sub-pixel includes at least one thin film transistor TFT and an organic light emitting device OLED. The thin film transistor TFT is not limited to a structure of FIG. 10, but the number and structures of thin film transistors may vary.

Referring to FIG. 10, the organic light-emitting display apparatus 1000 includes a display substrate 1011 and a thin film encapsulation (TFE) layer 1040 over the display substrate 1011.

The display substrate 1011 includes a flexible glass substrate or a flexible plastic substrate. The display substrate 1011 may be transparent, semi-transparent, or translucent.

A buffer film 1012 may be on the display substrate 1011. The buffer film 1012 may cover an entire upper surface of the display substrate 1011. The buffer film 1012 may include an inorganic material or an organic material. The buffer film 1012 may include a single film or a multi-film.

The thin film transistor TFT may be over the buffer film 1012. In an embodiment, the thin film transistor TFT is illustrated as a top gate transistor. However, a thin film transistor TFT having a structure, such as a bottom gate transistor, which is different from the thin film transistor TFT of FIG. 10, may be used in the organic light-emitting display apparatus 1000.

A semiconductor active layer 1013 may be on the buffer layer 1012.

The semiconductor active layer 1013 may include a source area 1014 and a drain area 1015 that are doped with N-type impurity ions or P-type impurity ions. A channel area 1016, which is not doped with impurities, may be between the source area 1014 and the drain area 1015. The semiconductor active layer 1013 may include an organic semiconductor, an inorganic semiconductor, or amorphous silicon. In an embodiment, the semiconductor active layer 1013 may include oxide semiconductor.

A gate insulation film 1017 may be deposited on the semiconductor active layer 1013. The gate insulation film 1017 may include an inorganic film. The gate insulation film 1017 may include a single film or a multi-film.

A gate electrode 1018 may be on the gate insulation film 1017. The gate electrode 1018 may include a metal material having an excellent conductivity. The gate electrode 1018 may include a single film or a multi-film.

An interlayer insulation film 1019 may be on the gate electrode 1018. The interlayer insulation film 1019 may include an inorganic film or an organic film.

A source electrode 1020 and a drain electrode 1021 may be on the interlayer insulation film 1019. In detail, contact holes are formed by removing portions of the gate insulation film 1017 and of the interlayer insulation film 1019. The source area 1014 may be electrically connected to the source electrode 1020, and the drain area 1015 may be electrically connected to the drain electrode 1021, through the corresponding contact holes.

A passivation film 1022 may be on the source electrode 1020 and the drain electrode 1021. The passivation film 1022 may include an inorganic film or an organic film. A planarization film 1023 may be on the passivation film 1022. The planarization film 1023 may include an organic film. One of the passivation film 1022 and the planarization film 1023 may be omitted in other embodiments.

The thin film transistor TFT may be electrically connected to the organic light-emitting device OLED.

The organic light-emitting device OLED may be on the planarization film 1023. The organic light-emitting device OLED may include a first electrode 1025, an intermediate layer 1026, and a second electrode 1027.

The first electrode 1025 functions as an anode, and may include at least one of various conductive materials. The first electrode 1025 may include a transparent electrode or a reflective electrode. For example, when the first electrode 1025 includes the transparent electrode, the first electrode 1025 may include a transparent conductive film. When the first electrode 1025 includes the reflective electrode, the first electrode 1025 includes a reflective film, and a transparent conductive film over the reflective film.

A pixel defining film 1024 may be on the planarization film 1023. The pixel defining film 1024 may cover a portion (e.g., edges) of the first electrode 1025. In detail, the pixel defining film 1024 may define a light-emitting area of the sub-pixel by covering an edge of the first electrode 1025. The first electrode 1025 may be patterned in each sub-pixel. The pixel defining film 1024 may include an organic film or an inorganic film. The pixel defining film 1024 may include a single film or a multi-film.

The intermediate layer 1026 may be at an area of the first electrode 1025 by etching a portion of the pixel defining film 1024 to expose the area of the first electrode 1025. The intermediate layer 1026 may be formed according to a deposition method. The intermediate layer 1026 may include an organic emission layer.

In another embodiment, the intermediate layer 1026 may further include at least one of a hole injection layer (HIL), a hole transport layer (HTL), an electron transport layer (ETL), and an electron injection layer (EIL). However, the present disclosure is not limited thereto. The intermediate layer 1026 may include the organic emission layer, and may further include at least one of various functional layers.

The second electrode 1027 may be on the intermediate layer 1026. The second electrode 1027 functions as a cathode. The second electrode 1027 may include a transparent electrode or a reflective electrode. For example, when the second electrode 1027 includes the transparent electrode, the second electrode 1027 may include a metal film, and a transparent film on the metal film. When the second electrode 1027 includes the reflective electrode, the second electrode 1027 may include a metal film.

In an embodiment, a plurality of sub-pixels may be over the display substrate 1011. For example, the sub-pixels may respectively display red, green, blue, and white colors. However, the present disclosure is not limited thereto.

The TFE layer 1040 may cover the organic light-emitting device OLED. The TFE layer 1040 may include an inorganic film 1041 and an organic film 1042 that are alternately stacked. For example, the inorganic film 1041 includes a first inorganic film 1043, a second inorganic film 1044, and a third inorganic film 1045. The organic film 1042 includes a first organic film 1046 and a second organic film 1047.

As described above, in a flexible display apparatus according to the present disclosure and a display substrate is formed, a driver is inside a curvature portion (CP) of the display substrate, such that a bezel is reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A flexible display apparatus comprising:
   a display substrate comprising:
      a light-emitting area; and
      a non-emitting area comprising a bending area foldable in a folding direction outside of the light-emitting area, and a pad area outside of the bending area;
   a thin film encapsulation layer over the light-emitting area;
   a driver inside a curvature portion of the display substrate at the bending area, and comprising a flexible film, a driving integrated circuit (IC), and a plurality of driving terminals on the flexible film at a first end thereof; and
   a circuit board on, and directly electrically connected to, the flexible film at a second end thereof, and extending therefrom, the second end being opposite the first end in a longitudinal direction of the circuit board,
   wherein a portion of the flexible film is in the curvature portion of the display substrate, is below and separated from a first portion of a second surface of the display substrate in a vertical direction, is above and separated from a second portion of the second surface of the display substrate in the vertical direction, and is connected to the plurality of driving terminals located above the second portion of the second surface of the display substrate,
   wherein the plurality of driving terminals are electrically connected to a plurality of pad terminals in the pad area through penetration wirings in via holes defined by the display substrate, and
   wherein the driving terminals are connected to the pad terminals at the second surface of the display substrate.

2. The flexible display apparatus of claim 1, wherein the thin film encapsulation layer is over a first surface of the display substrate, and
   wherein the driver is below the second surface of the display substrate that is opposite to the first surface.

3. The flexible display apparatus of claim 2, wherein at least a portion of the pad area overlaps the thin film encapsulation layer in a thickness direction of the display substrate.

4. The flexible display apparatus of claim 2, wherein the driver is between the light-emitting area and the pad area.

5. The flexible display apparatus of claim 4, further comprising at least one component in a gap between the light-emitting area and the pad area.

6. The flexible display apparatus of claim 5, wherein the gap is between a first portion of the second surface of the display substrate, which corresponds to the light-emitting area, and a second portion of the second surface of the display substrate, which corresponds to the pad area.

7. The flexible display apparatus of claim 5, wherein a radius of curvature of the display substrate accommodates the at least one component.

8. The flexible display apparatus of claim 2, wherein the bending area is folded in the folding direction away from the thin film encapsulation layer about a bending line spaced from an edge of the thin film encapsulation layer.

9. The flexible display apparatus of claim 2, wherein at least a portion of the driver is foldable.

10. The flexible display apparatus of claim 9, wherein an extension of a bending area of the driver is outside of a curvature portion of the display substrate.

11. The flexible display apparatus of claim 10, wherein a radius of curvature of the driver accommodates the display substrate.

12. The flexible display apparatus of claim 2, further comprising at least one protection film on the second surface, and defining a space therein, wherein the bending area is adjacent the space defined by the protection film.

13. The flexible display apparatus of claim 2, wherein the non-emitting area and the light-emitting area collectively define notches at corners thereof.

14. The flexible display apparatus of claim 2, wherein the driving integrated circuit (IC) is on the flexible film, and
wherein the driving terminals are at an edge of the flexible film at positions corresponding to the pad terminals.

15. The flexible display apparatus of claim 2, wherein the driving integrated circuit (IC) is on the second surface of the display substrate, and
wherein the driving terminals are at an edge of the flexible film, and are electrically connected to the driving integrated circuit (IC) through the pad terminals.

16. The flexible display apparatus of claim 1, wherein each of the pad terminals comprises:
a first end on the first surface of the display substrate; and
a second end on the second surface of the display substrate, electrically connected to the first end through a corresponding one of the penetration wirings, and connected to a respective one of the driving terminals.

17. The flexible display apparatus of claim 1, wherein the pad terminals comprise:
a plurality of first pad terminals at a first row of the display substrate; and
a plurality of second pad terminals at a second row of the display substrate.

18. The flexible display apparatus of claim 17, wherein the first row is adjacent the second row in a first direction, and
wherein the first pad terminals and the second pad terminals are alternately positioned in a second direction crossing the first direction.

19. The flexible display apparatus of claim 1, wherein the display substrate comprises:
a thin film transistor;
an organic light-emitting device electrically connected to the thin film transistor; and
a plurality of insulation layers insulating the thin film transistor from the organic light-emitting device,
wherein the plurality of insulation layers include planarization film or pixel defining film.

* * * * *